United States Patent
Shimizu et al.

(10) Patent No.: US 6,355,569 B1
(45) Date of Patent: *Mar. 12, 2002

(54) DRY ETCHING METHOD AND APPARATUS

(75) Inventors: Masao Shimizu, Moriyama; Kumayasu Yoshii, Osaka; Kiyoshi Yasutake, Minou, all of (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,763

(22) Filed: Sep. 17, 1998

(30) Foreign Application Priority Data

Sep. 17, 1997 (JP) .............................. 9-251569

(51) Int. Cl.[7] .......................................... H01L 21/3065
(52) U.S. Cl. ....................... 438/706; 438/707; 438/710; 438/711
(58) Field of Search ................................ 438/707, 729, 438/695, 706, 710, 733, 711; 427/582; 156/345

(56) References Cited

U.S. PATENT DOCUMENTS

| | | | | |
|---|---|---|---|---|
| 4,260,649 A | * | 4/1981 | Dension et al. | 427/582 |
| 4,492,610 A | * | 1/1985 | Okano et al. | 438/729 |
| 4,529,475 A | * | 7/1985 | Okano et al. | 438/695 |
| 4,668,337 A | * | 5/1987 | Sakine et al. | 438/707 |
| 5,108,535 A | * | 4/1992 | Ono et al. | 156/345 |
| 5,838,468 A | * | 11/1998 | Manako et al. | 359/15 |

* cited by examiner

*Primary Examiner*—Benjamin L. Utech
*Assistant Examiner*—Binh X Tran
(74) *Attorney, Agent, or Firm*—Connolly Bove Lodge & Hutz, LLP; Robert M. Trepp

(57) ABSTRACT

An accurate dry etching technique is described that employs a flow of neutral radicals and a light beam. A dry etching apparatus 50 employs a neutral radical flow source 20 and a light beam 40 to irradiate a flow of neutral radicals 32, so that the velocity component of the neutral radicals parallel to the surface of an object to be etched 12 is reduced, and etches anisotropically the object to be etched, while the object 12 is exposed to the radical flow 32 whose parallel velocity component is decreased. The invention reduces the problem of etching parallel to the substrate while etching perpendicular to the substrate to improve anisotropic dry etching without any adverse or damage producing effect to dielectric or semiconductor layers due to ions.

12 Claims, 2 Drawing Sheets

DRY ETCHING METHOD AND APPARATUS

FIELD OF THE INVENTION

The present invention relates to a dry etching technique, and in particular to an anisotropic dry etching method that is employed in the semiconductor field for the delicate processing of thin film layers, and an apparatus therefor.

BACKGROUND OF THE INVENTION

In accordance with increases in the storage densities provided for semiconductor memories, such as DRAMs, the widths of lines in thin film layers deposited on semiconductor substrates have become narrower, and at present, methods are being pursued by which to provide lines having widths of 0.1 micron or less.

Concomitantly, there is a demand for an improvement in the preciseness available with anisotropic dry etching, which is used for the delicate fabrication of a thin film layer, i.e., an improvement on the accuracy provided by etching performed perpendicular to the substrate, while the occurrence of etching parallel to the substrate is reduced to the minimum possible.

In response to this demand, for improved etching properties, a conventional anisotropic dry etching technique now employs the force of an electric field or of a magnetic field to increase the velocity of charged particles traveling perpendicular to a substrate containing reactive ions, such as fluorine ions.

However, with this method, damage incurred to a semiconductor layer due to the reactive ions is increased in accordance with the increase in the kinetic energy of the reactive ions, and either a defect will occur in the layer, or the quality of the layer will be altered.

To resolve the conventional problems, it is one object of the present invention to provide an accurate dry etching technique having no adverse or damage producing effect.

It is another object of the present invention to provide a new dry etching technique that employs a particle flow and a light beam, especially a flow of neutral radicals and a light beam.

SUMMARY OF THE INVENTION

To achieve the above objects, according to the present invention, a dry etching method comprises the steps of: preparing an object to be etched; preparing a flow of neutral radicals; irradiating the flow of neutral radicals with a light beam to impart a change in the velocity component of the neutral radicals parallel to the surface of the object to be etched; and etching the object to be etched while the object to be etched is exposed to the flow of the neutral radicals whose parallel velocity component has been altered.

Further, according to the present invention, a dry etching apparatus comprises: a vacuum container; an object table provided in the vacuum container to hold thereon an object to be etched; a neutral radical flow source, located at a position opposite the surface of the object table on which the object to be etched is mounted, for emitting a flow of neutral radicals directed toward the object to be etched mounted on the object table; and a light beam source, located between the object table and the neutral radical flow source, for emitting a light beam to irradiate the flow of the neutral radicals emitted by the neutral radical flow source to impart a change in the velocity component of the neutral radicals parallel to the surface of the object to be etched.

More specifically, a dry etching method comprises the steps of: preparing an object to be etched; preparing a flow of neutral radicals; irradiating the flow of neutral radicals with a light beam so that their velocity component parallel to a surface of the object is reduced; and exposing the flow of neutral radicals whose parallel velocity component is decreased as it approaches the object and upon impact, etching the object.

In addition, according to the present invention, a dry etching apparatus more specifically comprises: a vacuum container; an object table provided in the vacuum container on which to mount thereon an object to be etched; a radical flow source, located at a position opposite the surface of the object table on which the object to be etched is mounted, for emitting a flow of neutral radicals toward the object to be etched mounted on the object table; and a light beam source, located between the object table and the radical flow source, for irradiating a light beam toward the flow of the neutral radicals emitted by the radical flow source, so that the velocity component of the neutral radicals parallel to the surface of the object to be etched is negligible compared to the velocity component perpendicular to the surface.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENT

Figure 1:
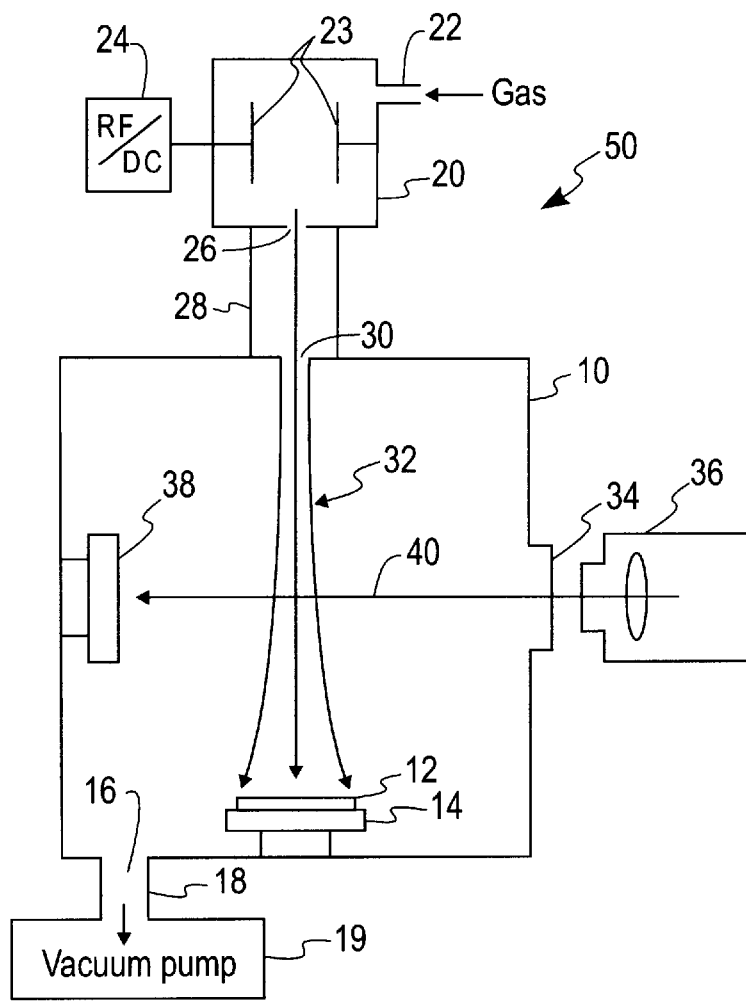
FIG. 1 is a side view of a cross-section of a dry etching apparatus according to one embodiment of the present invention.

FIG. 1 is a side view of a cross-section of a dry etching apparatus 50 according to one embodiment of the present invention.

An object table 14 for mounting thereon an object to be etched 12, and an evacuation opening 16 are formed in the lower portion of a vacuum container (chamber) 10. An evacuating pipe 18 communicates with the opening 16, and the end of the pipe 18 is connected to a vacuum pump 19, such as a turbo molecular pump.

A radical flow source (also called a "radical gun") 20 is located at a position above the vacuum container 10 and opposite to the object table 14, and emits a flow of neutral radicals toward an object to be etched. An opening 22 is formed for the introduction by the radical flow source 20 of $F_2$, $SF_6$, $NF_3$, $CF_4$ or other halogenated chemicals, which are gases for the production of neutral halogen radicals which may be a single halogen atom, a free radical containing a halogen atom or one or more atoms forming a molecule or molecular fragment containing at least one atom of a halogen. A free radical may be a group of atoms bonded together that is considered an entity in various kinds of reactions. In addition, electrodes 23 are provided in the radical flow source 20. An RF/DC power source 24 is connected to the electrodes 23 to perform decomposition of the gas and separation of ions and radicals between the electrodes 23. A microwave source may be employed instead of the RF/DC power source 24 to decompose the gas. The radical flow source 20 has an opening 26 and a guide 28, which is so connected to the vacuum container 10 that it covers an opening 30 formed in the vacuum container 10.

A transparent window 34 is formed in a side wall of the vacuum container 10, and a light beam source 36 is located at a position opposite the window 34. A laser beam source is used as the light beam source 36. A mirror 38 is provided on the side wall of the vacuum container 10 opposite the window 34.

Figure 2:
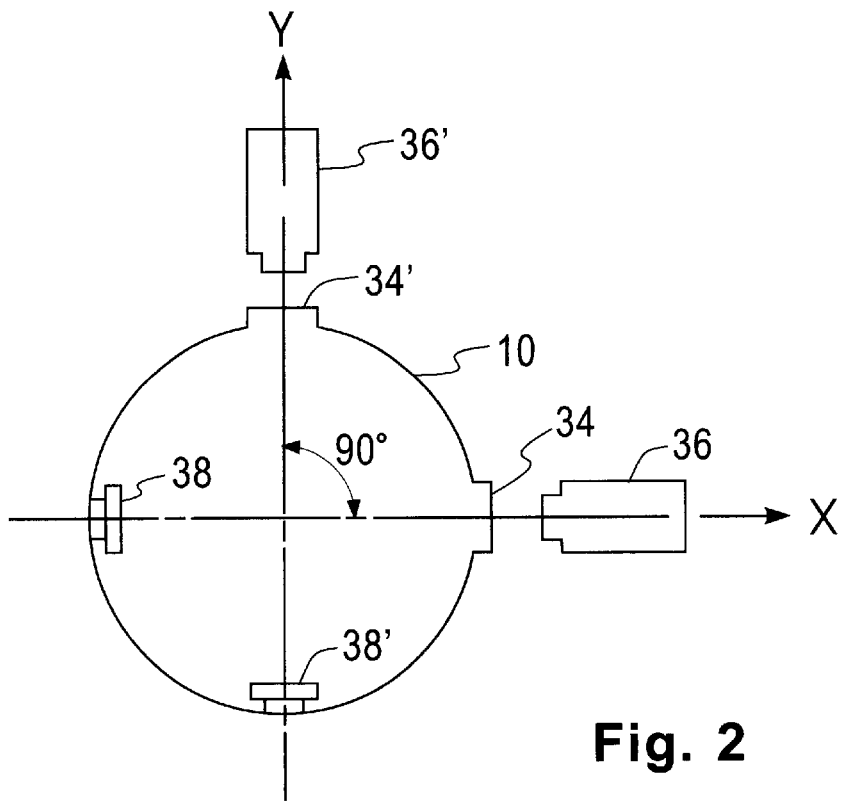
FIG. 2 is a top view of a cross-section of the dry etching apparatus according to the embodiment of the present invention.

FIG. 2 is a cross-sectional top view of the center portion of the dry etching apparatus 50. Two light beam sources are provided: the light beam source 36 in the X axial direction and the light beam source 36' in the Y axial direction. The window 34 and the mirror 38 are provided for the light beam source 36, while the window 34' and the mirror 38' are provided for the light beam source 361.

Figure 3:
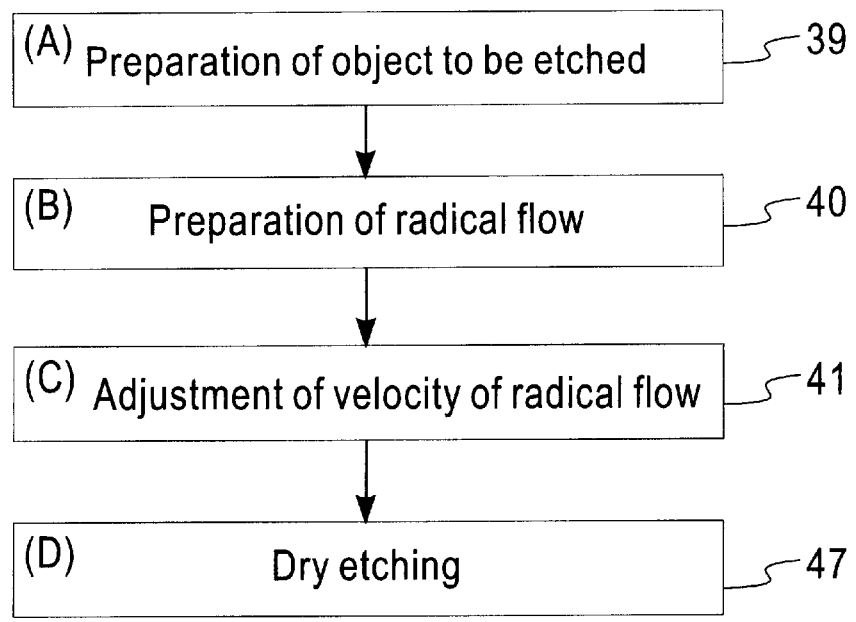
FIG. 3 is a flowchart for a dry etching method according to the present invention.

FIG. 3 is a flowchart showing a dry etching method according to the present invention.

Step (A), Preparation of object to be etched is shown in box 39 in FIG. 3. An object to be etched is mounted on the object table 14 of the vacuum container 10, and then air in the vacuum container 10 is evacuated by a vacuum pump 19, such as a diffusion pump or a turbo molecular pump, until a vacuum is attained in the container 10. The object to be etched is Si substrate on which is deposited $SiO_2$, for which, for example, a patterned photoresist layer is formed.

Step (B), Preparation of radical flow is shown in box 40 in FIG. 3. Gas for a radical flow, such as $F_2$, $SF_6$, $NF_3$ or $CF_4$, is introduced into the neutral radical flow source 20 through the opening 22. The gas is decomposed between the electrodes 23 by the RF power supplied from the RF/DC power source 24. Ions and fluorine radicals are separated by the electric field generated by a DC voltage, and only the fluorine radicals are introduced through the opening 26. The flow of radicals, after being passed through the opening 26, is transmitted along the guide 28 and enters the vacuum container 10 through the opening 30.

At this time, because of a difference in pressure between the radical flow source 20 (the guide 28) and the vacuum container 10, the fluorine radical flow is linearly directed as a beam toward the object to be etched. It should be noted, however, that as represented by 32 in FIG. 1, the fluorine radical beam spreads as it approaches the object to be etched. The internal (excitation) energy and the velocity of the fluorine radicals are controlled by gas pressure, RF power, a DC voltage and the distance between the electrodes.

Step (C), Adjustment of velocity of radical flow is shown in box 41 in FIG. 3. The fluorine radical flow, which linearly transits the vacuum container 10 toward the object to be etched, is irradiated by light beams 40 in the X and the Y axial directions that respectively are emitted by the light beam sources 36 and 36'. The light beams 40 are emitted in directions perpendicular to the direction in which the fluorine radical beam is projected. The light beams 40, after irradiating the fluorine radical beam, are reflected by the mirrors 38 and 38', and again irradiate the fluorine radical beam.

A laser beam source is used as the light beam source 36 for irradiating the fluorine radicals. The laser that is employed has a central emission wavelength of "685.6+Δ" nm, which is slightly longer than the 685.6 nm that is a resonance wavelength for transient energy between the $3s^4P_{5/2}$ level and the $3p^4D^o_{7/2}$ level of fluorine atoms. This is because the Doppler cooling effect, which will be described later, is employed. "Δ" indicates an appropriate wavelength width that is smaller than 1 nm.

When a laser beam irradiates the flow of radicals, the velocity component of the radicals parallel to the surface of the object to be etched is reduced due to the Doppler cooling effect. That is, since kinetic momentum is exchanged by the photons of the laser beam emitted by the laser beam source 36 and fluorine atoms, the velocity component of the fluorine atoms in the X axial direction (FIG. 2) is reduced. Similarly, since kinetic momentum is exchanged between the photons of the laser beam emitted by the laser beam source 36' and fluorine atoms, the velocity of the fluorine atoms in the Y axial direction (FIG. 2) is reduced. As a result, the velocity component perpendicular to the surface of the object to be etched (in the Z direction) is relatively increased. It is possible to reduce the velocity components of the fluorine atoms in the X and Y axial directions almost to zero, and as a result, the fluorine radicals will enter or impact the surface of the object to be etched perpendicularly. Therefore, the control of the locus of neutral radicals, which is difficult conventionally, is implemented.

The Doppler cooling effect will be further explained. The Doppler cooling effect is attained by the employment of the optical Doppler effect to reduce the velocity of moving neutral atoms. A detailed explanation will be given below.

Figure 4:
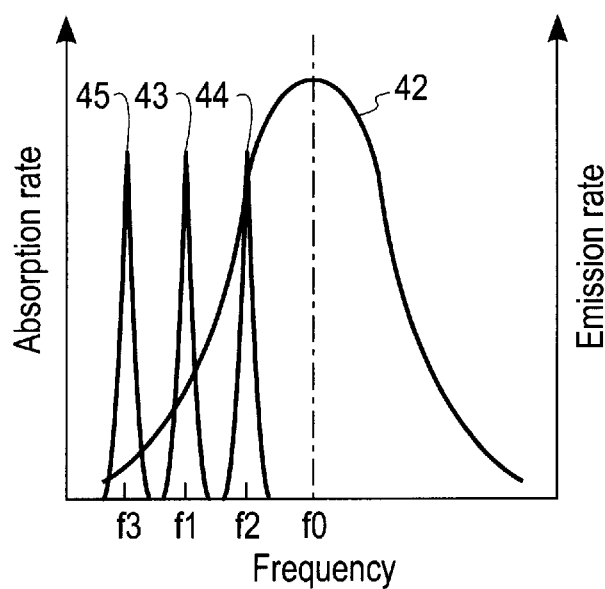
FIG. 4 is a graph showing the relationship between an atomic resonance absorption curve and emission spectra for laser beams.

FIG. 4 is a graph showing a relationship between an atomic resonance absorption curve 42 and the emission spectra of laser beams. A resonance absorption curve 42 in FIG. 4 peaks at central frequency $f_0$, and represents the relationship between the resonance absorption rate for fluorine atoms and the frequency of light. Lines 43, 44 and 45 represent emission spectra for laser beams having their central emission frequencies $f_1$, $f_2$ and $f_3$ as seen by a fluorine atom. Specifically, the central frequency $f_0$ corresponds to 685.6 nm, which is the resonance wavelength for transition energy between the $3s^4P_{5/2}$ level and the $3p^4D^o_{7/2}$ level for fluorine atoms. In addition, this frequency is lower than the frequency $f_0$ of the laser beam the equivalent of the above described wavelength width Δ.

Assume that the fluorine atoms are moving at velocity v toward the laser beam (toward the laser beam source 36 in FIG. 2) that is emitted by the laser beam source 36 and that along the X axis has a frequency of $f_1$. In this case, when the light velocity is c, the frequency $f_2$ for the laser beam viewed from the fluorine atoms is $$f_2 = f_1/(1-v/c).$$

That is, the emission spectrum for the laser beam viewed from the fluorine atoms shows a curve 44, as in FIG. 4, not a curve 43, in FIG. 4.

Assume that the fluorine atoms are moving at velocity v in the same direction as the laser beam (in the direction toward the mirror 38 along the X axis). The frequency $f_3$ of the laser beam viewed from the fluorine atoms is $$f_3 = f_1/(1+v/c).$$

Then, the emission spectrum shows a curve 45, as in FIG. 4, not the curve 43.

Let us discuss the relationship between the resonance absorption curve and the change in the frequency of the light, relative to the fluorine atoms, that is due to the Doppler effect. As is apparent from FIG. 4, since the frequency is nearer the peak resonance absorption frequency when it is changed to the frequency $f_2$ (spectrum 44), more light resonance absorption occurs than when the frequency is changed to the frequency $f_3$ (spectrum 45). That is, light resonance absorption for the fluorine atoms that are moving toward the laser beam source 36 along the X axis in FIG. 2 is greater than that for the fluorine atoms that are moving toward the mirror 38 on the opposite side, and as a result, there is a difference in the quantities of light they absorb.

The fluorine atoms, which are moving toward the light source 36 that has absorbed more light, are altered and enter an excited state, i.e., their energy level is changed to the excitation level. Then, the light is emitted and the fluorine atoms acquire a more stable energy state, i.e., they are returned to the lower energy level. Since the light emitted at this time is isotropically radiated by the atoms, no force is applied to the fluorine atoms in a specific direction due to the spontaneous emission of the light.

Under a situation of momentum conservation, the fluorine atoms moving toward the laser beam source 36 absorb not only the light but also are influenced by the kinetic momentum held by photons. The kinetic momentum influencing the fluorine atoms acts as force to move the fluorine atoms in a direction opposite to that in which they are traveling. That is, under the conditions associated with momentum conversation, an exchange of kinetic momentum occurs between the atoms and the photons, and the fluorine atoms are subjected to a driving force impelling them toward the mirror 38, which is in the opposite direction to the direction in which they are traveling along the X axis. As a result, the velocity of the fluorine atoms, which are traveling along the X axis toward the laser beam source 36, is reduced.

The fluorine atoms that are traveling toward the mirror 38 also acquire the kinetic momentum from the photons. However, since these fluorine atoms do not absorb much light, the acquired momentum is accordingly negligible. As a result, no force is applied, in the direction of travel, to the fluorine atoms that are traveling toward the mirror 38. The velocity increase is also negligible.

The same conditions can be predicated for the fluorine radical atoms that are traveling in concert with a laser beam that is reflected by the mirror 38. More specifically, the velocity of the fluorine radical atoms that are traveling toward the X axial laser beam (toward the mirror 38) can be reduced by the Doppler cooling effect. In addition to the previously described reduction in the velocity when the fluorine atoms are traveling toward the X axial laser beam 36, the velocity of the fluorine atoms is reduced in the X axial direction.

The above explanation is given for a case wherein fluorine atoms are traveling along the X axis. Actually, the X axial component $v_x$ of the velocity vector v of the fluorine atoms is reduced.

The same conditions can be predicated for the Y axis in FIG. 2. The velocity of the fluorine radical atoms traveling in the Y axial direction can be reduced by the Doppler cooling effect produced by a laser beam. As a result, the velocity component, of the fluorine radical atoms that are irradiated by the laser beam, that is perpendicular to the surface of the object to be etched (in the Z axial direction) is relatively increased.

Step (D), Dry etching is shown in box 47 in FIG. 3.

The object to be etched is etched in a direction perpendicular to the surface by reactions occurring between the fluorine radicals, which are perpendicularly incident to the surface of the object, and the atoms or molecules of the object. In short, the object to be etched is anisotropically etched by the fluorine radicals.

When a Si substrate is employed on which is deposited $SiO_2$, for which a patterned photoresist layer is provided, a predetermined $SiO_2$ pattern is formed by dry etching as outlined in FIG. 3. No damage due to ions is introduced in a pattern formed on the $SiO_2$ or the Si substrate. Since the fluorine radicals are perpendicularly incident to the surface of the object to be etched without having any velocity components parallel to the surface, a more delicate anisotropic pattern can be formed.

The preferred embodiment has been described, but the present invention is not limited to this embodiment and can be variously modified or applied as within the scope of the subject of the present invention. In the above embodiment, the light beam is used to reduce the velocity component of the fluorine radicals traveling parallel to the surface of the object to be etched; however, the light beam may be used to increase the above velocity component and to relatively reduce the velocity component perpendicular to the surface of the object (in the Z axial direction), so that a flow of fluorine radicals can be spread across the surface of the object to be etched. For example, $f_1$, may be above $f_0$ instead of below $f_0$ by the same absolute amount to utilize curve 42 above $f_0$ to increase the parallel velocity component.

Having thus described our invention, what we claim as new and desire to secure by Letters Patent is:

1. A method for dry etching comprising the steps of:

preparing an object to be etched;

flowing neutral radicals in a beam towards a surface of said object wherein said beam spreads as it approaches said object;

irradiating said beam of neutral radicals with a light beam to impart a change in their velocity component parallel to said surface of said object to be etched whereby said velocity component parallel to said surface is reduced due to a Doppler cooling effect; and exposing said beam of neutral radicals to said surface of said object and etching said object.

2. The dry etching method according to claim 1, wherein said light beam is a laser beam.

3. The dry etching method according to claim 1, wherein said object to be etched includes a semiconductor substrate.

4. The dry etching method according to claim 1, wherein said neutral radicals include flourine atoms or other halogen radicals.

5. The dry etching method according to claim 4, wherein said laser beam has a light wavelength of $685.6+\Delta$, when radical fluorine atoms are used.

6. The dry etching method according to claim 1, wherein said step of irradiating said beam of neutral radicals includes a step of exchanging kinetic momentum between the photons of said light beam and said neutral radicals (Doppler cooling effect) to reduce said velocity component of said neutral radicals parallel to said surface of said object to be etched.

7. The dry etching method according to claim 6, wherein said light beam has a wavelength of "$W+\Delta$" which is slightly greater than a wavelength of "W" that resonates when said neutral radicals have a transition level.

8. The dry etching method according to claim 6, wherein said step of preparing said object to be etched includes a step of mounting said object to be etched on a table provided in a vacuum container.

9. The dry etching method according to claim 8, wherein said step of flowing neutral radicals in a beam includes the step of emitting a neutral radical beam toward said object to be etched from a source of neutral radical flow provided at a position opposite to said etching surface of said object to be etched mounted on said table.

10. The dry etching method according to claim 9, wherein said step of irradiation with said light beam includes irradiation with a light beam traveling in a direction that is substantially perpendicular to a direction in which said neutral radical beam is projected.

11. The dry etching method according to claim 9, wherein said step of irradiation with said light beam includes irradiation with a light beam traveling along paths leading in at least two different directions that are substantially perpendicular to a direction in which said neutral radical beam is projected.

12. The dry etching method according to claim 11, wherein said two different directions diverge at an angle of 90 degrees.

* * * * *